United States Patent [19]

Meckel et al.

[11] 4,426,275

[45] Jan. 17, 1984

[54] SPUTTERING DEVICE ADAPTABLE FOR COATING HEAT-SENSITIVE SUBSTRATES

[75] Inventors: Benjamin B. Meckel, Del Mar; Nathan K. Meckel, LaMesa, both of Calif.

[73] Assignee: Deposition Technology, Inc., San Diego, Calif.

[21] Appl. No.: 325,143

[22] Filed: Nov. 27, 1981

[51] Int. Cl.$^3$ .............................................. C23C 15/00
[52] U.S. Cl. .................................. 204/298; 204/192 R
[58] Field of Search ............... 204/192 R, 192 C, 298

[56] References Cited

U.S. PATENT DOCUMENTS

| | | | |
|---|---|---|---|
| 3,897,325 | 7/1975 | Aoshima et al. | 204/298 |
| 4,022,947 | 5/1977 | Grubb et al. | 428/432 |
| 4,046,660 | 9/1977 | Fraser | 204/192 C |

*Primary Examiner*—Aaron Weisstuch

*Attorney, Agent, or Firm*—Bruno J. Verbeck; Michael L. Slonecker

[57] ABSTRACT

Disclosed herein is means adapted for use in combination with magnetically-enhanced sputtering devices whereby said devices are rendered more useful for sputter-coating substrates susceptible to heat-induced deterioration. Said means comprises a screen-like mesh or grid member disposed intermediate the target of said device and the substrate to be coated, and in such a position that said means is also disposed across the magnetic field formed by said device. Said screen-like mesh or grid member is formed of material which is magnetizable in response to the disposition thereof across said magnetic field. Said screen-like mesh or grid member has the desirable effect of suppressing the expansion of heated plasma whereby said plasma is confined to a region proximate said target and generally away from said substrate. Also disclosed is improved anodic means for collecting fast electrons emitted from said target.

22 Claims, 4 Drawing Figures

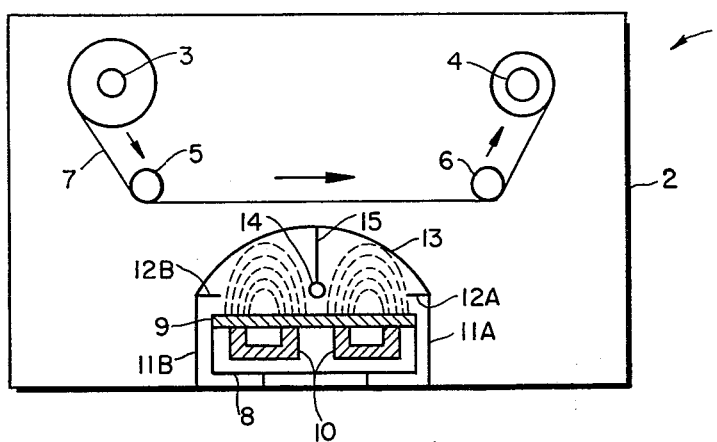
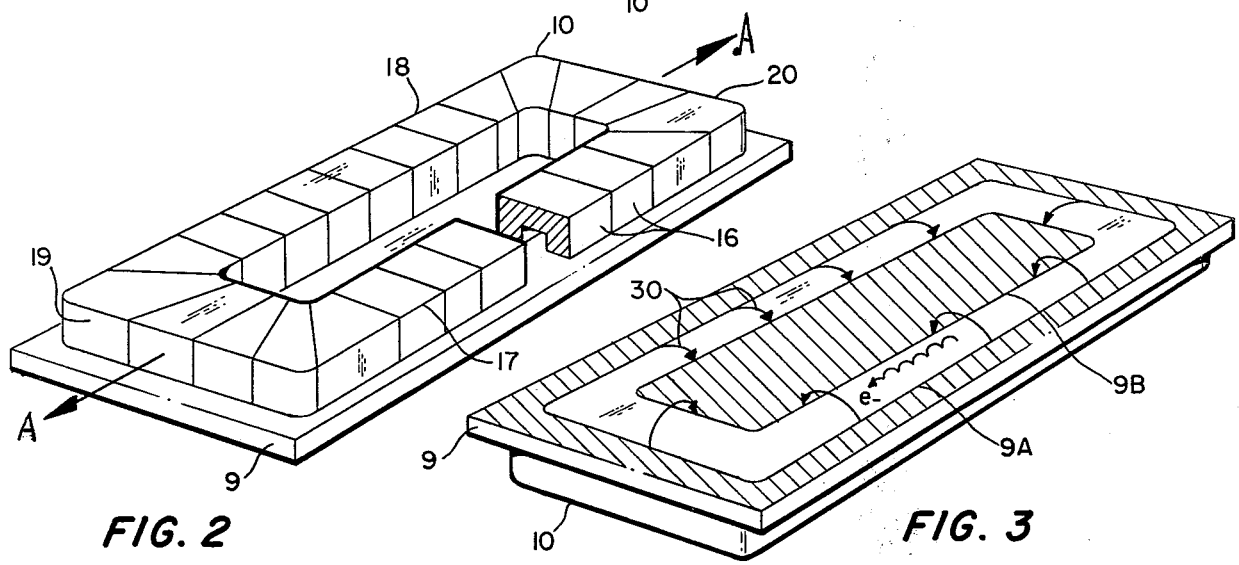
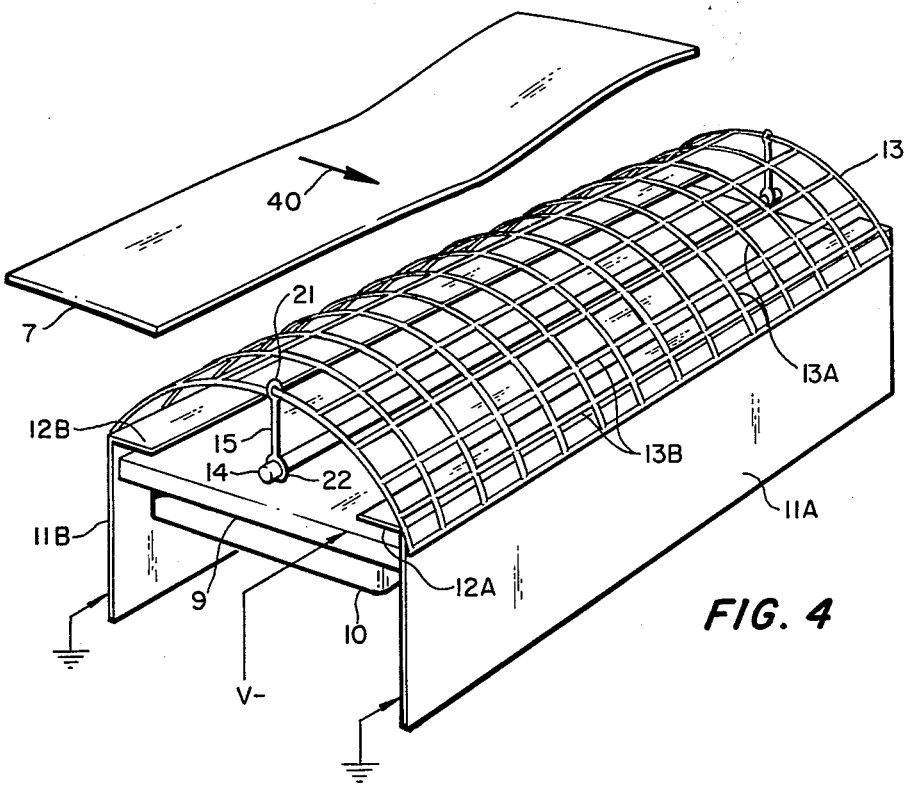
FIG. 1
FIG. 2
FIG. 3
FIG. 4

SPUTTERING DEVICE ADAPTABLE FOR COATING HEAT-SENSITIVE SUBSTRATES

BACKGROUND OF THE INVENTION

This invention generally relates to sputtering devices, and more particularly to sputtering devices employing magnetic field forming means for enhancing the sputtering of select materials upon a substrate. As will be more fully appreciated from the discussion which follows, this invention involves an improvement to such sputtering devices which renders them particularly useful in coating substrates which are susceptible to deterioration from excessive heat.

An exemplary embodiment of a sputtering device to which this invention relates is a planar magnetron. Briefly stated, a planar magnetron is a sputtering device comprising a cathode, a rectangular planar target connected to, and maintained at, substantially the same high negative potential applied to the cathode, and a plurality of permanent magnets or electromagnets positioned proximate a surface of the target. Said magnets are generally arranged in a closed-loop, or racetrack, configuration such that the lines of magnetic flux produced by said magnets result in the formation of a magnetic field which projects outwardly from the opposite surface of the target and generally towards the substrate to be coated. Because of the closed-loop configuration of said magnets, the magnetic field produced thereby is also of a closed-loop, or racetrack, configuration.

Planar magnetrons sputter efficiently because the magnetic field acts to trap therewithin certain of the electrons emitted from the target. These electrons, under the influence of the magnetic field, are caused to travel small cycloidal paths along the racetrack and result in the formation of additional ions as the electrons interact with the sputtering plasma.

While sputtering devices of the foregoing type are well-known to the art and widely used in certain industrial processes for coating substrates, several drawbacks reside therein which render them not altogether satisfactory for efficiently coating substrates susceptible to heat-induced deterioration. Substrates of this type include, for example, thin film substrates formed from polyester and other similar heat-sensitive materials.

Three sources of heating have been identified which contribute to the deterioration of substrates formed from polyester and other similar materials. The first of these sources, of course, are the sputtered atoms themselves which are emitted from the target for eventual deposition upon the substrate. These atoms arrive at the substrate with a substantial amount of kinetic energy that is converted to heat as the atoms impact the substrate surface being coated. Pre-cooling of the substrate prior to atom impaction therewith is a common method for mitigating this problem.

The second heat source is the fast electrons which leave the target at or near the potential of the ion bombardment energy. These fast electrons, which leave the target from surface portions thereof lying outside of the racetrack defined by the magnetic field, are not to any substantial degree influenced by the magnetic field and are, therefore, available for impaction upon the substrate. The prior art has collected some of these fast electrons by placing an anode about the perimeter of the target. While useful in collecting some of the fast electrons, the prior art solution does not solve the problem of collecting fast electrons emitted from the surface portion of the target which is surrounded by the racetrack.

And finally, the third identified heat source is the heated plasma itself. While the magnetic field of a planar magnetron maintains a fairly close confining force on the ions of the sputtering discharge or plasma, the mass of the ions is such that even at a few tens of electron volts those ions can escape the magnetic field. The ions which extend beyond the magnetic field exhibit a tendency to migrate towards the substrate and carry with them substantial quantities of both kinetic and potential energy, which energy is converted into heat by the impaction of those ions upon the substrate. If the plasma density is low, i.e.—in the microampere range, the ion heating effect is usually almost negligible. However, as the plasma density is increased, i.e.—in the milliampere range, a substantial amount of heating is experienced at the substrate. Insofar as the inventors herein are aware, no solution to the ion migration problem just described has been forthcoming and, until the present invention, is a problem which remains and detracts from the ability of presently available sputtering devices to coat heat-sensitive substrates.

In view of the foregoing, it is the primary object of this invention to provide new and useful means for confining heated plasma so that heat-sensitive substrates can be coated in a fast, efficient, reliable, and economical manner.

Another object of this invention is to provide new and useful means for intercepting and collecting fast electrons which would otherwise result in the deterioration of a heat-sensitive substrate.

SUMMARY OF THE INVENTION

The foregoing and other objects of this invention are achieved by interposing between the sputtering target of a planar magnetron and the substrate to be coated new and useful means for confining heated plasma proximate the target and away from the substrate. The plasma confining means comprises a screen-like mesh or grid disposed across the magnetic field formed by the planar magnetron, the mesh or grid being formed of material responsive to the magnetic field such that the material becomes magnetized upon the disposition thereof across the magnetic field. The magnetization of the mesh or grid results in the confinement of the plasma between the mesh or grid and the target.

In addition to forming what is believed to be a magnetic field barrier which more effectively confines the heated plasma away from the substrate to be coated, the connection of the mesh or grid to a perimeter anode surrounding the target results in the charging of the mesh or grid to substantially the anode potential. As a consequence of said connection the mesh or grid also, it is believed, operates as an electrostatic barrier which to an additional degree suppresses fast electron migration from the target to the substrate without significantly detracting from sputtered atom migration from the target to the substrate.

So that a more efficient collection of the fast electrons emitted from the surface portion of the target surrounded by the racetrack is obtained, an anode is disposed intermediate the mesh or grid and the target at a position proximate to said surface portion. Fast electrons emitted from said surface portion are thus intercepted by the anode and collected thereupon.

BRIEF DESCRIPTION OF THE DRAWINGS

The advantageous results which inure from the practice of this invention will be more fully understood from the detailed description of the preferred embodiment for this invention taken together with the accompanying drawings wherein:

FIG. 1 is a somewhat diagrammatic side view of the preferred embodiment of this invention;

FIG. 2 is a perspective view of a planar magnetron target and the means typically associated therewith for producing a magnetic field;

FIG. 3 is a perspective view of a planar magnetron target generally illustrating the shape of the magnetic field produced by the combination shown in FIG. 2; and FIG. 4 is a partial perspective view of the preferred embodiment shown in FIG. 1 which more clearly illustrates same.

DETAILED DESCRIPTION OF THE PREFERRED EMBODIMENT

Referring to FIG. 1, therein is illustrated a sputtering device 1 as adapted for practice of the present invention. Sputtering device 1 comprises a chamber 2 wherein a high vacuum can be produced. Supported within chamber 1 is a supply spool 3, a take-up spool 4, and adjustable tension rollers 5 and 6, the combination of said spools and rollers generally defining the path along which a substrate 7 travels during the sputtering operations. Not shown in the figure are the several high-vacuum pumps and gas inlets associated with device 1, it being generally understood that such pumps and inlets are common to all sputtering devices.

Disposed subjacent substrate 7, and electrically isolated from chamber 2, is a cathode 8 having a target 9 electrically connected thereto so that said target is maintained at substantially the same electrical potential as the cathode. Disposed subjacent target 9 is means 10 for forming a magnetic field which projects outwardly from a portion of a surface of target 9 and generally towards substrate 7. The dashed lines shown in FIG. 1 are generally representative of the lines of magnetic flux produced by means 10 and defining said magnetic field.

Projecting upwardly from the floor of chamber 2 are spaced-parallel cathode shields 11A and 11B, each of said shields, respectively, having flanges 12A and 12B formed along a distal end portion thereof. Flanges 12A and 12B are generally in co-planar alignment and substantially parallel to target 9.

Referring, for the moment, to FIG. 4, it will be understood that a high negative potential V⁻ is applied to target 9 and that cathode shields 11A and 11B are connected to ground. In this manner flanges 12A and 12B are caused to operate as perimeter anodes which collect certain of the fast electrons emited from target 9, which fast electrons, if not collected, would otherwise be available for impaction upon substrate 7.

As thus far described, it will be understood that sputtering device 1 comprises a somewhat typical sputtering device of the kind employing magnetic field forming means for enhancing sputtering. As previously discussed, such devices have proven to be not altogether satisfactory for coating substrates susceptible to heat-induced deterioration.

Referring back to FIG. 1, the problem of heat-induced deterioration is mitigated to a substantial degree by the addition of means 13 for confining heated plasma proximate target 9 and away from the surface of substrate 7 being coated. Means 13, which will be more fully discussed hereinafter, is connected to each of cathode shields 11A and 11B and is positioned such that it is disposed across the magnetic field projecting outwardly from target 9. Depending from means 13, such as by hanger 15, is means 14 for intercepting and collecting other additional fast electrons not otherwise collected by flanges 12A and 12B.

Referring now to FIG. 2, therein is shown a perspective view of a typical planar magnetron target 9 and means 10 associated therewith for forming a magnetic field. Means 10 comprises a plurality of either permanent magnets or electromagnets 16 arranged in a closed-loop, or racetrack, configuration. One of said magnets has been removed in the figure to illustrate that each magnet 16 is generally trough-shaped in transverse cross-section and that the trough defined thereby is directed generally towards target 9. As formed in the manner shown in FIG. 2, means 10 has elongate leg portions 17 and 18 generally aligned parallel with the longitudinal axis A—A of target 9. Means 10 also includes integral leg portions 19 and 20 generally aligned transverse or perpendicular to said longitudinal axis.

Means 10 shown in FIG. 2 will generally yield a magnetic field which projects outwardly from the surface of target 9 opposite from said means. The general shape of said magnetic field is shown in, and best understood by reference to, FIG. 3. More specifically, the plurality of curved directional arrows communicating between lines 9A and 9B generally represent lines of magnetic flux and the region subjacent said directional arrows and enclosed between lines 9A and 9B generally represents the magnetic field defined by said lines of magnetic flux. The hatched area of target 9 bounded by the perimeter of said target and line 9A represents one portion of the target surface from which fast electrons are emitted, such fast electrons typically being collected by flanges 12A and 12B due to the proximity of said flanges to said surface portion. The hatched area of target 9 enclosed within and bounded by line 9B represents another portion of the target surface from which fast electrons are also typically emitted, and which fast electrons, until the present invention, have hitherto remained uncollected. As shown in FIG. 3, said magnetic field is generally complemental in shape to the shape of means 10 in FIG. 2 and is, therefore, also of a closed-loop, or racetrack, configuration. Electrons trapped within said magnetic field are generally caused to travel small cycloidal paths along the racetrack, substantially as illustrated, and thus result in the formation of additional ions as the trapped electrons collide with the sputtering plasma (not shown).

Referring now to FIG. 4, therein is illustrated a partial perspective view of the preferred embodiment of this invention and incorporates therein the several features previously discussed in reference to FIGS. 1, 2, and 3. Omitted from FIG. 4 are the various spools and rollers which impart motion to substrate 7, as well as both cathode 8 and chamber 2, the inclusion of said spools, rollers, cathode and chamber being considered unnecessary for an understanding of this invention.

More specifically, FIG. 4 illustrates substrate 7 as moving generally transverse to the longitudinal dimension of target 9 and in the direction of the arrow identified by reference numeral 40. Cathode shields 11A and 11B are positioned in spaced-parallel alignment proximate opposite sides of target 9. Means 10 is positioned proximate the surface of target 9 opposite from substrate 7, and flanges 12A and 12B are positioned proximate the surface of target 9 from which the magnetic field outwardly projects.

Connected to each of said shields and communicating therebetween are means 13 for confining the heated sputtering plasma away from the surface of substrate 7 being coated. Means 13 preferably comprises a plurality of spaced parallel members 13A communicating between said shields in a direction substantially transverse to the longitudinal axis of target 9, and a plurality of spaced parallel members 13B connecting each of members 13A and generally aligned perpendicular thereto. Members 13A and 13B together form a structure which can be characterized as a screen-like web or grid member.

Members 13A and 13B of means 13 are formed of material responsive to the magnetic field of means 10 such that said members become magnetized upon the disposition thereof across said magnetic field. The only other substantial limitation in the selection of such material is that it be substantially unaffected by the large quantity of heat generated during sputtering. Examples of materials suitable for forming means 13 include cobalt, iron and nickel.

Insofar as the dimensions and orientation of members 13A and 13B is concerned, the illustrated means 13 is not considered to be limiting of this invention. While the preferred embodiment utilizes members 13A and 13B having circular cross-sections, other cross-sectional configurations are expected to perform equally as well. Similarly, neither the specific orientation of members 13A and 13B to each other and to target 9 nor the spacing between adjacent members 13A and 13B is considered to be limiting. In fact, the only substantial limitation regarding said members is that adjacent members be spaced apart a distance sufficient so that they do not unnecessarily interfere with the migration of sputtered particles from target 9 to substrate 7.

A hanger 15 is connected by bracket 21 to said web or grid member and an anode 14, preferably in the form of an elongate rod or bar, is connected to hanger 15 by bracket 22. In this manner anode 14 is retained in spaced parallel alignment above target 9. Hanger 15 is preferably formed from electrically conductive material so that both means 13 and anode 14 are maintained at substantially the same electrical potential.

For purposes of illustration only, the elongate dimension of anode 14 has been exaggerated. In actual practice it is preferred that anode 14 have an elongate dimension which generally corresponds with the elongate dimension of the hatched area shown in FIG. 3 which is enclosed within line 9B. Furthermore, in actual practice hangers 15 are positioned so that anode 14 is positioned over said area. In this manner the distal end portions of the rod or bar comprising anode 14 remains substantially outside of the magnetic field, and thus outside of the region of dense heated plasma. The purpose for such preferred positioning of anode 14 is, of course, to avoid subjecting said anode to excessive heat.

Similar to the longitudinal dimension of anode 14, the transverse dimension thereof is also somewhat dependent upon the shape of the magnetic field formed by means 10. Said transverse dimension of anode 14 is preferably selected so that it is approximately equal to the transverse dimension of the area enclosed within line 9B of FIG. 3. Of course, an anode 14 of reduced transverse dimensions will also be quite satisfactory, though perhaps somewhat less efficient in collecting the fast electrons, depending upon the anode potential, the number of fast electrons, and the energy of said fast electrons as they leave the target surface.

In the preferred form of this invention anode 14 is formed of non-magnetizable material, and in particular 300 Series stainless steel. However, even magnetizable materials are expected to be suitable for forming anode 14 so long as the magnetic field formed by such anode does not significantly distort the magnetic field formed by means 10.

With means 10 energized to produce a magnetic field of the kind hereinbefore described, FIG. 4 illustrates the various electrical connections made prior to commencing sputtering of target 9 material onto substrate 7. A high negative voltage $V^-$ is applied to cathode 8 (not shown) and said voltage, in turn, is also applied to target 9 because of the electrical connection therebetween. Cathode shields 11A and 11B, flanges 12A and 12B, means 13, hanger 15, and anode 14 are each connected to each other and to ground, thus resulting in the functioning of the combination thereof as an anode.

As previously discussed, the magnetic field formed by means 10 maintains a close confining force on the sputtering discharge or plasma. Even so, the mass of ions contained in the plasma is such at even at a few tens of electron volts those ions can escape from the region of maximum magnetic field intensity towards the region of weaker intensity proximate the substrate. This phenomena is easily observed by viewing a conventional sputtering device during actual sputtering operations. For example, during sputtering from a stainless steel target such an observer will note that the plasma emits a bright reddish-blue glow which extends from the target up to the substrate surface. The inventors herein have discovered, however, that upon the insertion of a magnetizable mesh or grid as previously discussed the dense region of reddish-blue plasma is generally confined between said mesh or grid and the target, and the plasma decreases significantly in brightness as it extends away from the target. Above said mesh or grid it will be noted that the plasma has diminished to a very dull glow which, in most instances, is barely discernable to the observer. Such observation clearly indicates and confirms that the region intermediate the mesh or grid and the substrate is devoid of the dense plasma common to the region just above the discharge.

While the physical reactions taking place to confine the plasma are not completely understood, it is believed that the presence of the magnetizable mesh or grid results in the formation of a magnetic boundary which concentrates certain of the lines of magnetic flux defining the magnetic field produced by means 10 and thereby more efficiently contains the plasma. Furthermore, the imparting of an electrical potential to the mesh or grid so that it acts as an anode is believed to result in the formation of an electrostatic barrier which suppresses both plasma and fast electron migration from the target to the substrate.

Based upon the foregoing, it will be understood that disclosed herein are improved means for both confining heated plasma and for intercepting and collecting fast electrons, which heated plasma and fast electrons would otherwise adversely affect the sputter-coating of heat sensitive substrates. However, so that this invention is more clearly understood, the following specific example is provided:

The preferred embodiment of this invention utilizes a planar magnetron manufactured by Industrial Vacuum Engineering of San Mateo, Calif. The dimensions of the sputtering target affixed to said magnetron are approximately 74 in. × 10 in. × 0.5 in.

Cathode shields are provided in spaced parallel alignment proximate the sputtering target and are spaced therefrom about 0.20 in. Flanges are provided along each of the cathode shields, said flanges projecting inwardly towards the target a distance of about 1.0 in. and being spaced above the target a distance of about 0.25 in.

A typical heat-sensitive substrate suitable for coating by the foregoing device comprises 4300 polyester, a product manufactured by American Hoechst of Greer, S.C. Such a substrate is purchased in roll-form and is nominally 62 in. wide and 1.0 mils. thick. The substrate is translated along a path which is substantially parallel to the target and spaced-apart therefrom a distance of about 10 in.

The magnetizable grid connected to each of the cathode shields is formed of iron and was manufactured by U.S. Steel of Pittsburgh, Pa. Each of the rods forming said grid are about 0.10 in. dia. and are connected such that the spacing between adjacent rods is about 1 in. × 1.5 in. Said grid has a longitudinal dimension of about 54 in., a transverse dimension of about 18 in., and at its apex is about 7 in. above the target.

The anode, which depends from the grid, is formed of stainless steel, 300 Series, manufactured by U.S. Steel of Pittsburgh, Pa. Said anode is approximately 65 in. in length and about 1 in. in diameter. The hangers connecting the anode and grid are formed from iron wire.

While the preferred embodiment of the present invention has been specifically disclosed and described herein, it will, of course, be understood that various changes, rearrangements, and modifications can be made thereto without departing from the scope and spirit of the invention. Accordingly, all such changes, rearrangements and modifications are contemplated as may come within the scope of the appended claims.

What is claimed is:

1. In a sputtering device adaptable for coating heat-sensitive substrates, said device including a target member and means for forming a magnetic field which projects outwardly from a surface portion of said target member and generally towards a substrate, the improvement comprising means responsive to said magnetic field for confining heated plasma proximate said surface portion of said target member.

2. The device of claim 1 wherein said surface portion is generally characterized as being of a closed-loop, or racetrack, configuration, said closed-loop surface portion enclosing another surface portion of said target member, said device further comprising means for collecting fast electrons emitted from said enclosed surface portion.

3. The device of claim 1 or claim 2 wherein said heated plasma confining means comprises a screen-like member disposed across said magnetic field intermediate said target member and said substrate, said screen-like member being formed of magnetizable material.

4. The device of claim 3 wherein said magnetizable material is selected from the group consisting essentially of cobalt, iron, nickel, and combinations thereof.

5. The device of claim 2 wherein said fast electron collecting means comprises an anodic member disposed proximate said enclosed surface portion.

6. The device of claim 5 wherein said anodic member is formed of non-magnetizable material.

7. The device of claim 6 wherein said non-magnetizable material is stainless steel.

8. The device of claim 2 further comprising means connecting said heated plasma confining means and said fast electrons collecting means.

9. The device of claim 8 wherein said connecting means is formed of material which is electrically conductive whereby both said heated plasma confining means and said fast electron collecting means are each maintained at substantially the same electrical potential.

10. In a sputtering device adaptable for coating heat-sensitive substrates, said device including a target member, holder means for supporting a substrate in spaced apart relationship with said target member, means for introducing sputtering gas into the region intermediate said target member and a substrate supported by said holder means, means for converting said sputtering gas into heated plasma whereby to sputter material from said target member onto said substrate, and magnetic means for producing a magnetic field in said region for interaction with said heated plasma, the improvement which comprises grid means disposed within said region and responsive to said magnetic field for confining said heated plasma to substantially the region intermediate said grid means and said target member.

11. The device of claim 10 wherein said grid means comprises a grid member formed from magnetic material, said grid member assuming magnetic polarity under the influence of said magnetic field.

12. The device of claim 11 wherein said magnetic material is selected from the group consisting of essentially of cobalt, iron, nickel, and combinations thereof.

13. The device of claim 11 wherein said grid member comprises a plurality of rod-like elements having elongated longitudinal dimensions.

14. The device of claim 13 wherein at least some of said rod-like elements are substantially circular in transverse cross-section.

15. The device of claim 14 wherein said circular rod-like elements are about 0.1 inches in diameter.

16. The device of claim 13 wherein said grid member comprises a first group of said rod-like elements positioned substantially in spaced parallel alignment along their longitudinal dimensions, and a second group of said rod-like elements positioned substantially in spaced parallel alignment along their longitudinal dimensions and substantially perpendicularly connected to said first group.

17. The device of claim 16 wherein the rod-like elements contained in said first and second groups are spaced apart, respectively, about 1.0 and 1.5 inches.

18. In combination with a device as set forth in claim 10 wherein said magnetic means produces a magnetic field which projects outwardly from a surface portion of said target member and generally towards said substrate, said surface portion being of a closed-loop or racetrack configuration which encloses another surface portion of said target member, an anodic member positioned in the region intermediate said target member and said grid means and proximate said enclosed surface portion for collecting fast electrons emitted from said enclosed surface portion.

19. The device of claim 18 wherein said anodic member comprises an elongated rod-like member.

20. The device of claim 18 wherein said anodic member is formed of non-magnetizable material.

21. The device of claim 20 wherein said non-magnetizable material comprises stainless steel.

22. The device of claim 18 further comprising connecting means for maintaining said grid means and said anodic member at substantially the same electrical potential.

* * * * *